United States Patent [19]
Rettschlag et al.

[11] Patent Number: 6,087,221
[45] Date of Patent: Jul. 11, 2000

[54] METHOD OF FABRICATING TWO DISSIMILAR DEVICES WITH DIMINISHED PROCESSING STEPS

[75] Inventors: Gregg Rettschlag; Roger Lee, both of Boise, Id.

[73] Assignee: Micron Technology, Inc., Boise, Id.

[21] Appl. No.: 08/917,029

[22] Filed: Aug. 22, 1997

[51] Int. Cl.$^7$ .................................................. H01L 21/336
[52] U.S. Cl. ........................... 438/258; 438/266; 438/286
[58] Field of Search .................................... 438/258, 266, 438/286

[56] References Cited

U.S. PATENT DOCUMENTS

| | | | |
|---|---|---|---|
| 5,449,634 | 9/1995 | Inoue | 437/52 |
| 5,472,892 | 12/1995 | Gwen et al. | 437/43 |
| 5,512,504 | 4/1996 | Wolstenholme et al. | 437/43 |
| 5,604,142 | 2/1997 | Komori et al. | 437/43 |
| 5,668,034 | 9/1997 | Sery et al. | 438/266 |

OTHER PUBLICATIONS

Richard C. Jaeger, Introduction to Microelectronic Fabrication, vol. V, Addison–Wesley Publishing Company, pp. 13–21, 1993.

S. Wolf, Silicon Processing for the VLSI Era, vol. 2, Lattice Press, p. 635, 1990.

S. Wolf and R.N. Tauber, Silicon Processing for the VLSI Era, vol. 1, Lattice Press, p. 418–420, 1986.

Kume, H., et al., "A Flash–Erase EEPROM Cell with an Asymmetric Source and Drain Structure", *Int. Electron Devices Meeting: Technical Digest*, Washington, D.C., 560–563, (Dec. 1987).

Verma, G., et al., "Reliability Performance of ETOX Based Flash Memories", *26th Annual Proceedings: Reliability Physics*, Monterey, CA, 158–166, (April 1988).

*Primary Examiner*—Olik Chaudhuri
*Assistant Examiner*—Steven Rao
*Attorney, Agent, or Firm*—Schwegan, Lundberg, Woessner & Kluth, PA

[57] ABSTRACT

A method for fabricating dissimilar devices in an integrated circuit. In one embodiment, the method can be used to fabricate flash memory, including MOS transistors and flash cells. The method can be used to substantially cofabricate the MOS transistors and flash cells, particularly their gates. The method includes forming layers of adjacent materials for the MOS transistor gates and the flash cell gates, and simultaneously forming the MOS transistor gates and the flash cell gates from the layers of adjacent materials. The method further includes defining drains of the flash cells separate from defining sources of the flash cells.

28 Claims, 16 Drawing Sheets

METHOD OF FABRICATING TWO DISSIMILAR DEVICES WITH DIMINISHED PROCESSING STEPS

FIELD OF THE INVENTION

The present invention relates generally to a low cost method for fabricating at least two devices with dissimilar structures in integrated circuits, and more specifically to a low cost method for fabricating metal-oxide-semiconductor devices and flash cells in flash memory.

BACKGROUND OF THE INVENTION

Electronics technology has proliferated with the advent of inexpensive and high performance integrated circuits, including communication transceivers, microprocessors, and memory. As a result, complex electronic systems, such as personal computers and cellular telephones have become widely held consumer goods.

Integrated circuits are fabricated with multiple processing steps. Integrated circuits are often fabricated with one or more device types, including diodes, capacitors, and different varieties of transistors. These devices often have microscopic features that can only be manufactured with critical processing steps that require careful alignment of equipment used to build the devices. The critical processing steps are expensive because (1) they must be accomplished with costly and sophisticated equipment, and experienced operators, and (2) such steps are not always successful. When a processing step, particularly a critical processing step, is unsuccessful, the integrated circuit may fail. As a result, processing yields are decreased and production costs are increased.

Integrated circuits having two or more different device types require more processing steps, particularly critical processing steps, than integrated circuits having fewer device types. As a result, integrated circuit costs increase and yields decrease. Therefore, a process for fabricating an integrated circuit with multiple device types and having reduced processing steps, particularly critical processing steps, is desirable.

One type of integrated circuit is memory, such as flash memory. Memory typically includes a memory array, address decoder, and control logic. The memory array comprises cells, each of which stores a data bit. Control and address commands are externally communicated to the memory. These commands direct the memory array to externally receive or transmit data respectively into or from a specific cell of the memory array.

The control logic and address devices are conventionally implemented with metal-oxide-semiconductor (MOS) transistors. The cells of the memory array are conventionally implemented with flash cells. MOS transistors and flash cells have distinct structures. Typically, these two devices are fabricated with separate processing steps, including critical processing steps. However, it is desirable to cofabricate MOS transistors and flash cells to diminish the number of processing steps, particularly critical processing steps, used to manufacture flash memory.

SUMMARY OF THE INVENTION

In accordance with the present invention, there is provided a low cost method of fabricating devices with dissimilar structures in an integrated circuit. The integrated circuit may be part of a larger system.

One embodiment of the present invention permits fabrication of a memory, such as flash memory with fewer fabrication steps, including critical processing steps. This feature is achieved in flash memory by coprocessing the MOS transistors and the flash cells. It is therefore a benefit of the present invention to fabricate memory, such as flash memory, with fewer processing steps and reticles, and with an increased yield. As a result, the cost of producing the memory is reduced. Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention is directed toward facilitating low cost fabrication of at least two devices with dissimilar structures. This goal is achieved by reducing the number of processing steps, particularly critical processing steps, used to fabricate integrated circuits with at least two devices with dissimilar structures.

Figure 1A:
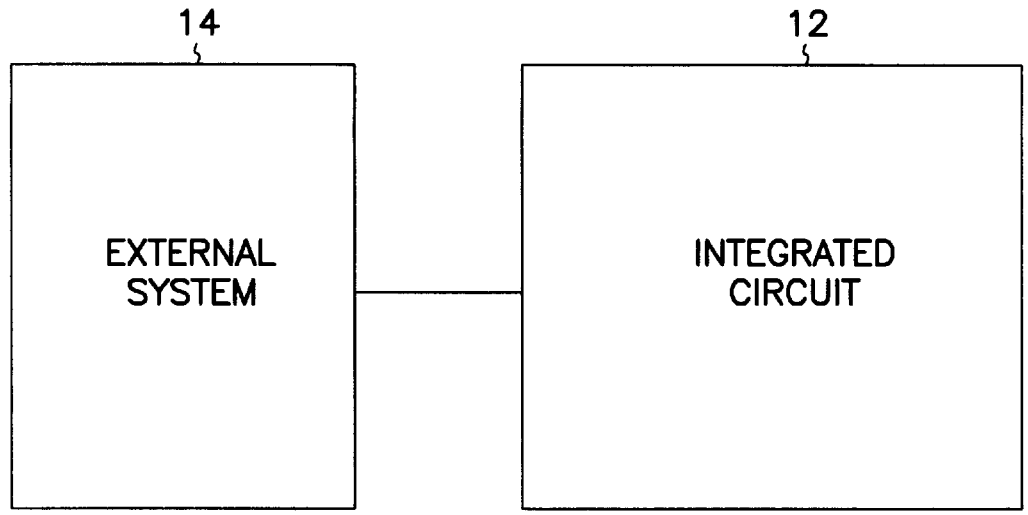
FIG. 1A illustrates a block diagram of one embodiment of an integrated circuit coupled to an external system.

In one embodiment, the present invention is used to fabricate an integrated circuit. The integrated circuit 12 may be coupled to an external system 14 as illustrated in FIG. 1A. The integrated circuit 12 and the external system 14 may be respectively flash memory and a microprocessor. Alternatively, the external system 14 may be a microcomputer, a cellular telephone, or another form of electronic equipment.

Figure 1B:
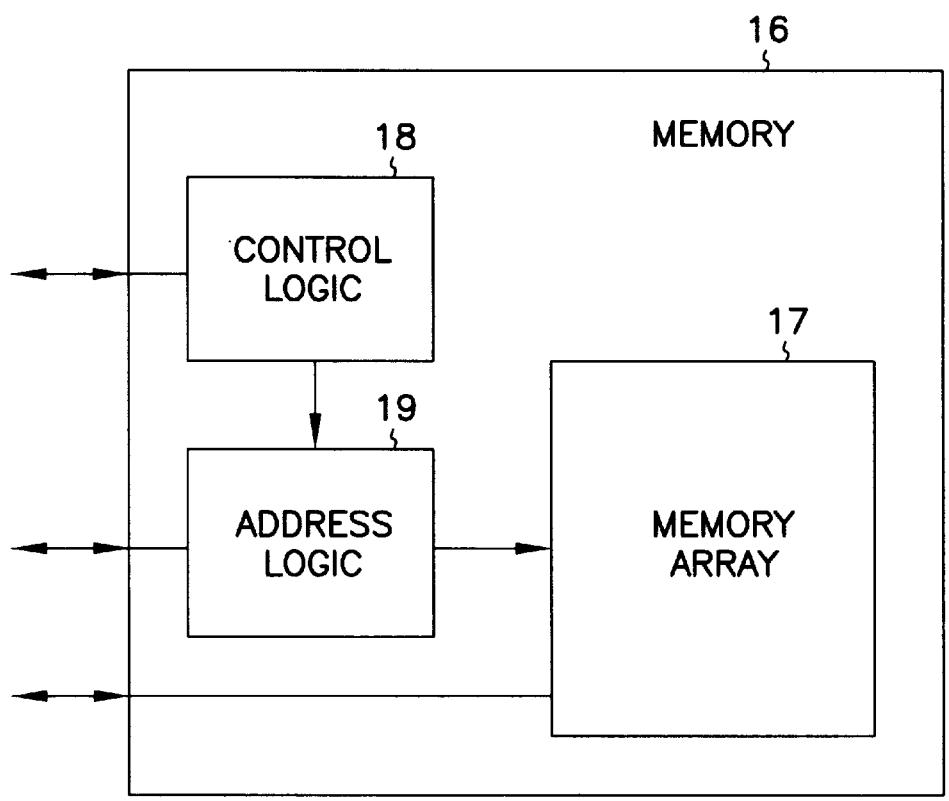
FIG. 1B illustrates a block diagram of one embodiment of a memory.

FIG. 1B illustrates one embodiment of a memory 16, such as flash memory. The memory includes a memory array 17, control logic 18, and address logic 19. The memory array 17 may be a flash memory array.

Memory operation will now be briefly described. The address logic 19 receives an address from the external system 14. The control logic 18 receives external commands to store or retrieve data to or from the flash memory array 17 at cell location(s) provided to the address logic 19 by the external system 14. Subsequently, the data associated with cell location(s) is respectively transmitted to or received from the external system 14.

Figure 2:
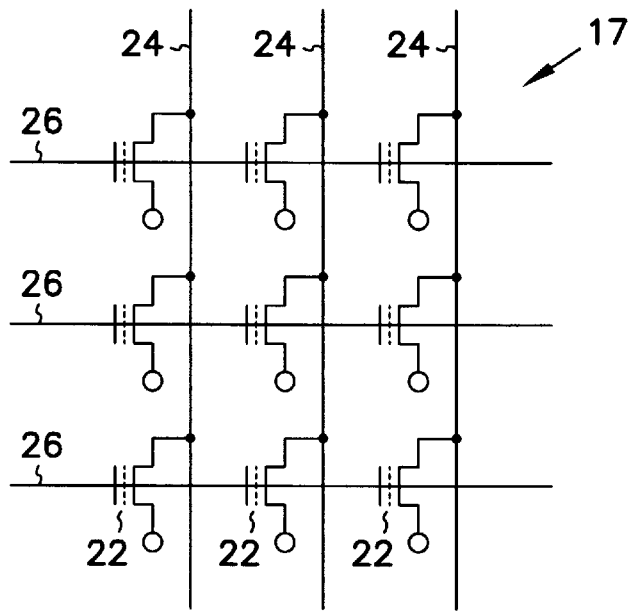
FIG. 2 illustrates a schematic diagram of one embodiment of a memory array.

FIG. 2 illustrates one embodiment of a memory array 17, specifically a flash memory array. The flash memory array includes wordlines 26 and bit lines 24 of cells, specifically flash cells 22. Each flash cell 22 is implemented with a floating gate transistor. The drains of the floating gate transistors are connected to bit lines 24. The control gates of the floating gate transistors are connected to wordlines 26. Each flash cell 22 stores a bit of information that may be addressed by appropriately biasing the corresponding wordline 26 and a bit line 24.

Figure 3A:
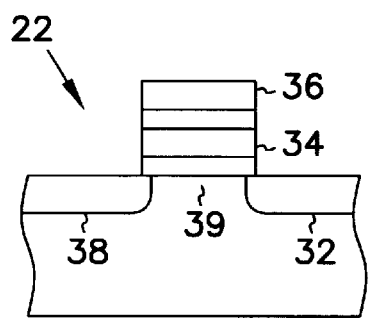
FIG. 3A illustrates a cross-sectional view of one embodiment of a flash cell in flash memory.
Figure 3B:
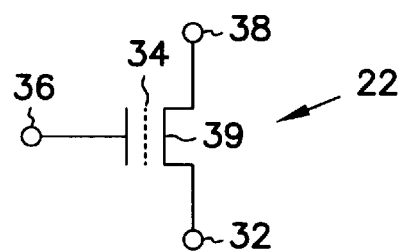
FIG. 3B illustrates a schematic diagram of one embodiment of the flash cell in flash memory.

FIGS. 3A and 3B illustrate one embodiment of the flash cell 22. The source 32 of the flash cell 22 is held at a potential, such as ground, when data is read or programmed respectively from or to the flash cell 22. Data is coupled into and out of the flash cell 22 through the drain 38 of the flash cell 22. The drain 38 is coupled to the bit line 24. A channel 39 separates the drain 38 and source 32 of the flash cell 22.

Each flash cell 22 is non-volatile since it has a floating gate 34 capable of semipermanent charge storage. The amount of charge stored in the floating gate 34 determines the data value that is stored in the corresponding flash cell 22. In flash memory 16, the charge stored in the floating gate 34 is erasable by appropriately changing the voltage applied between the control gate 36 and the source 32 in a manner known to one skilled in the art.

Figure 4A:
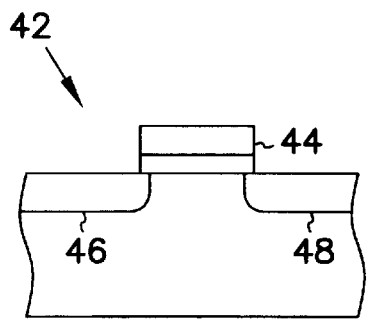
FIG. 4A illustrates cross-sectional view of one embodiment of a MOS transistor in flash memory.
Figure 4B:
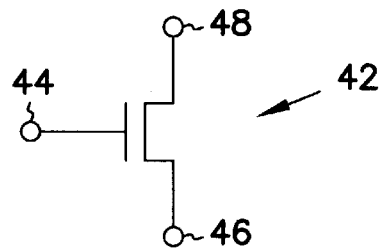
FIG. 4B illustrates a schematic diagram of one embodiment of the MOS transistor in flash memory.

Other parts of the flash memory 16 are not, however, implemented with flash cells 22. The control logic 18 and address logic 19 are typically implemented with metal-oxide-semiconductor (MOS) devices, such as MOS transistors 42. The MOS transistors 42 may be p-channel or n-channel MOS transistors. FIGS. 4A and 4B illustrate one embodiment of the MOS transistor 42 that includes a gate 44, a source 46, and a drain 48. The structures of a MOS transistor 42 and a flash cell 22 are dissimilar because only the flash cell 22 has a floating gate 34. Operation of both flash cells 22 and MOS transistors 42 are understood by persons skilled in the art.

One embodiment of the present invention discloses a method of cofabricating MOS transistors 42 and flash cells 22 with fewer processing steps, particularly critical processing steps, and reticles than conventional fabrication techniques. Specifically, some critical processing steps used to define the flash cells 22 and the MOS transistors 42 have been combined, reducing the number of critical processing steps used in flash memory 16 fabrication. Furthermore, critical processing steps have been replaced with non-critical processing steps implemented with self-aligned processing techniques. Self-aligned processing techniques facilitate increased processing tolerances because fabrication of a first device feature can be aligned to an already constructed second device feature.

In the instant embodiment, a portion of the MOS transistors 42 and flash cells 22 may be initially fabricated using conventional processing steps known by one skilled in the art. For example, building block materials, including insulators, such as oxide and oxide-nitride-oxide (ONO), conductors, such as silicon and silicide, may be deposited on a base layer, such as an insulator or semiconductor. For example, the base layer may be sapphire or silicon. The silicon and silicide may be respectively polysilicon and tungsten silicide. In the instant embodiment, the MOS transistor 42 and flash cell 22 are formed from materials, including base layer, conductor, and insulator.

In FIGS. 5A through 18B, figures A and B respectively represent a MOS transistor and a flash cell, on the same base layer, being coprocessed simultaneously. The individual processing steps are implemented in a manner known to persons skilled in the art.

Figure 5A:
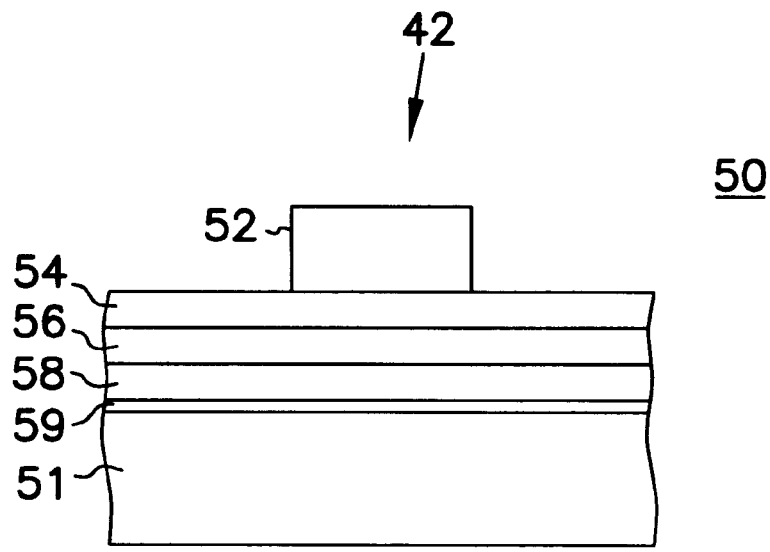
FIG. 5A illustrates a cross-sectional view of one embodiment of a partially fabricated MOS transistor after patterning a first resist.
Figure 5B:
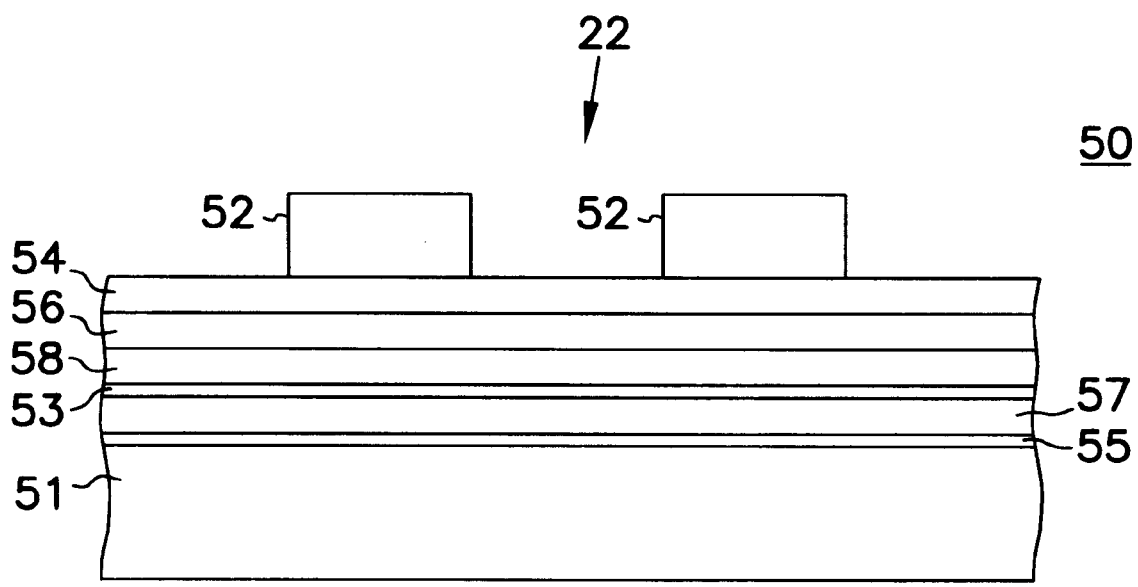
FIG. 5B illustrates a cross-sectional view of one embodiment of a partially fabricated flash cell after patterning the first resist.

FIGS. 5A and 5B illustrate one embodiment of the first step of the instant embodiment, in which a first resist 52 is selectively patterned on a first insulator 54 (step 50). The first insulator 54 is preferably an oxide of at least 1000 angstroms thickness.

The regions covered by the first resist 52 define the gates of the MOS transistors 42 and flash cells 22. The MOS transistor 42 is substantially formed by adjacent materials, including the first insulator 54, a first conductor 56, second conductor 58, and second insulator 59, all placed above the base layer 51. The first conductor 56 may be a silicide, such as tungsten silicide. The second conductor 58 may be silicon, such as polysilicon. The second insulator 59 may be oxide.

The flash cell 22 is also substantially formed by adjacent materials, including the first insulator 54, the first conductor 56, the second conductor 58, a third insulator 53, a third conductor 57, and a fourth insulator 55, all placed above the base layer 51. The third insulator 53 may be an ONO. The fourth insulator 55 may be oxide. The third conductor 57 may be silicon, such as polysilicon.

Figure 6A:
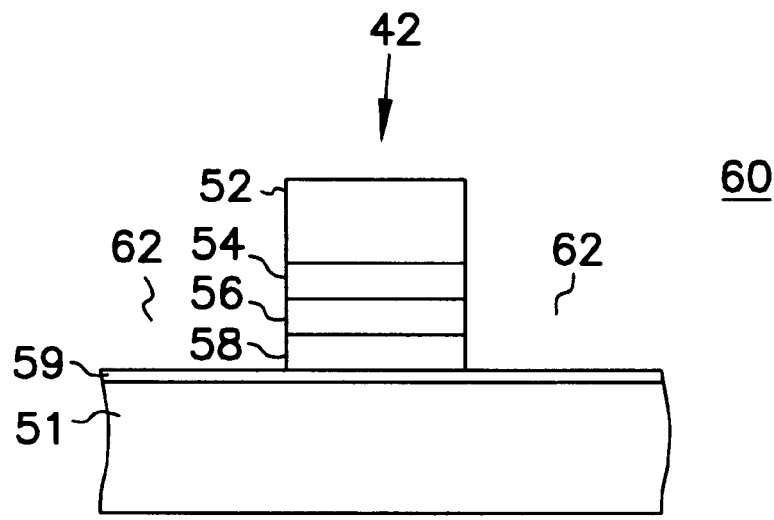
FIG. 6A illustrates a cross-sectional view of one embodiment of a partially fabricated MOS transistor after removing regions not covered by the first resist.
Figure 6B:
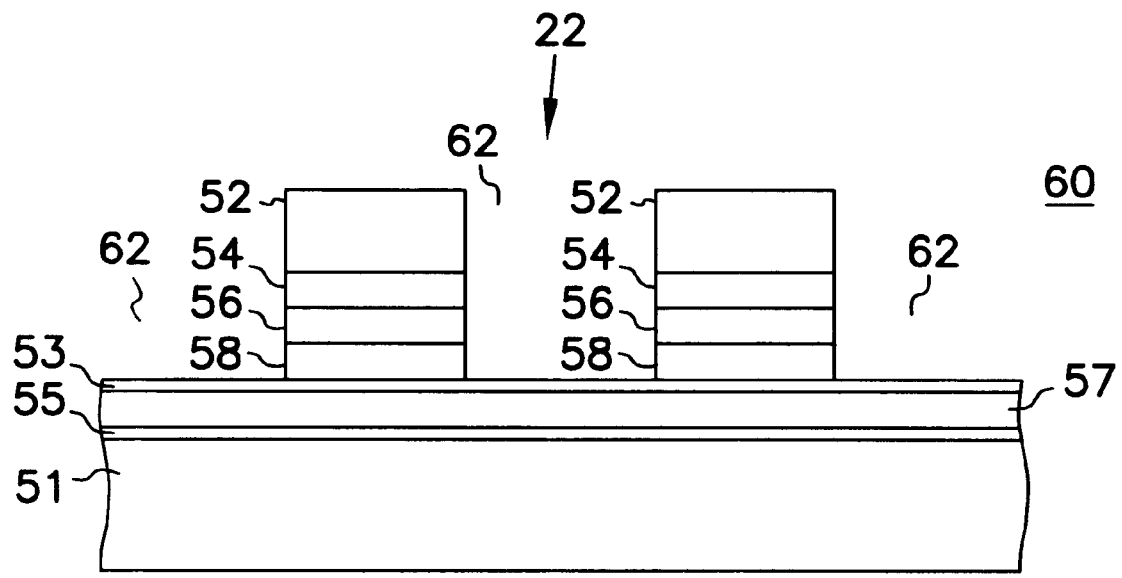
FIG. 6B illustrates a cross-sectional view of one embodiment of a partially fabricated flash cell after removing regions not covered by the first resist.
Figure 7A:
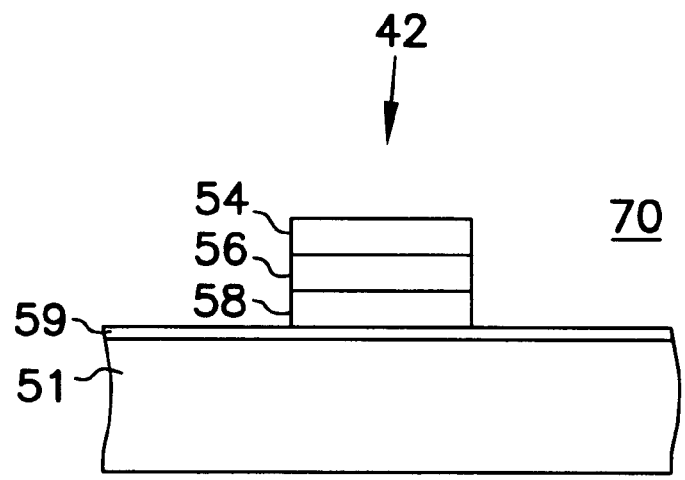
FIG. 7A illustrates a cross-sectional view of one embodiment of a partially fabricated MOS transistor after removing the first resist.
Figure 7B:
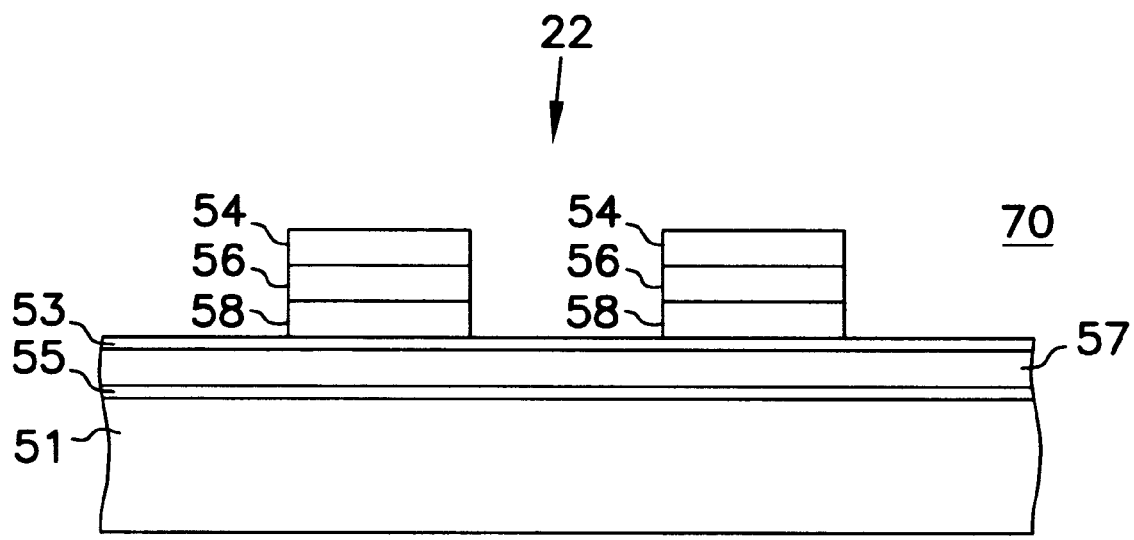
FIG. 7B illustrates a cross-sectional view of one embodiment of a partially fabricated flash cell after removing the first resist.

Subsequently, as shown in FIGS. 6A and 6B, a first region 62 of the first insulator 54, first conductor 56, and second conductor 58 not covered by the first resist 52 is removed, such as by etching (step 60). Then, the first resist 52 is removed from the MOS transistor 42 and flash cell 22 (step 70) as shown in FIGS. 7A and 7B. The resulting structures substantially form the gates of the MOS transistors 42 and flash cells 22. In the instant embodiment, steps 50, 60 and 70 result in the simultaneous and substantial cofabrication of flash cells 22 and MOS transistors 42.

Figure 8A:
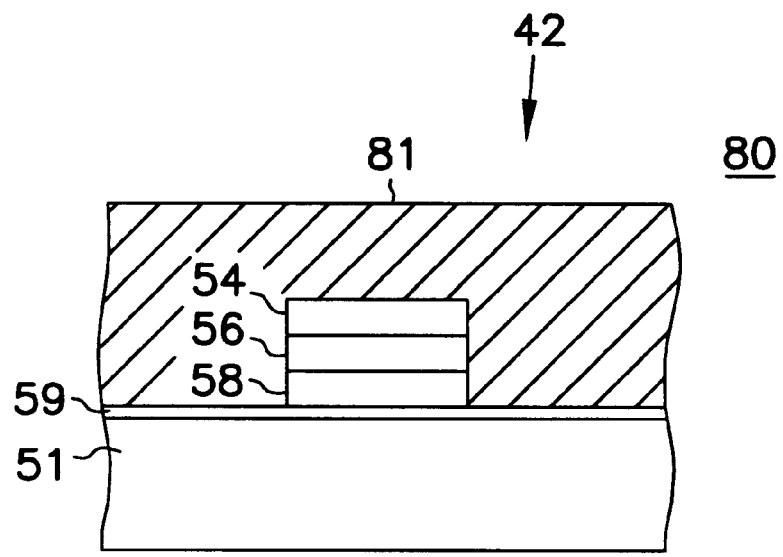
FIG. 8A illustrates a cross-sectional view of one embodiment of a partially fabricated MOS transistor after patterning a second resist.
Figure 8B:
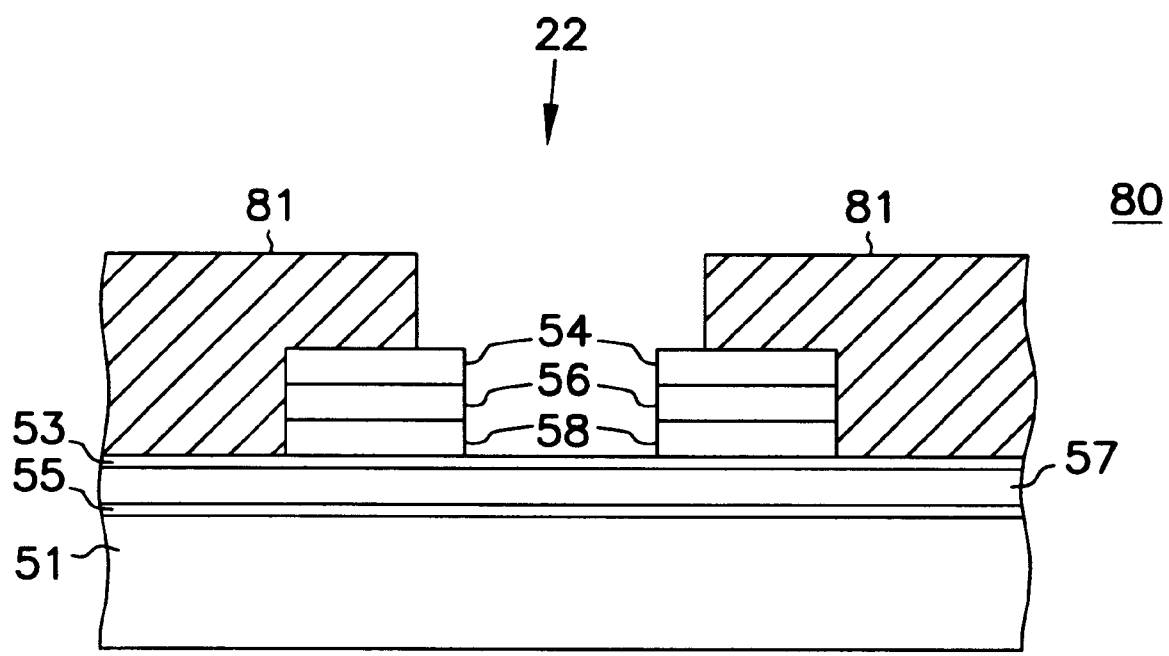
FIG. 8B illustrates a cross-sectional view of one embodiment of a partially fabricated flash cell after patterning the second resist.
Figure 9A:
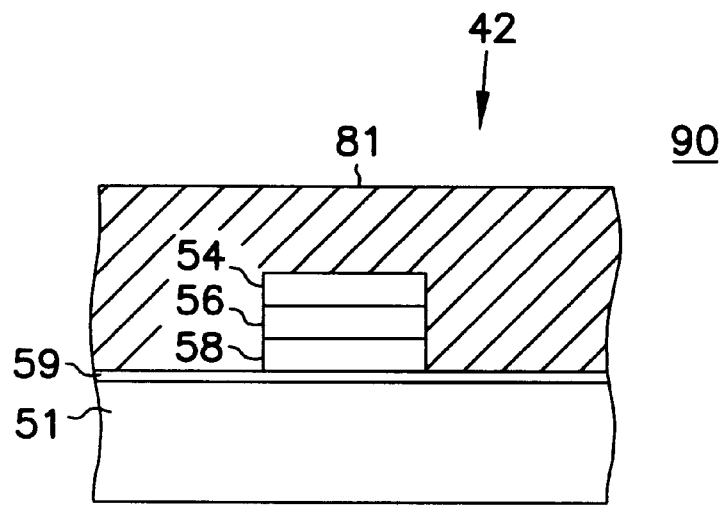
FIG. 9A illustrates a cross-sectional view of one embodiment of a partially fabricated MOS transistor after removing regions not covered by the patterned second resist.
Figure 9B:
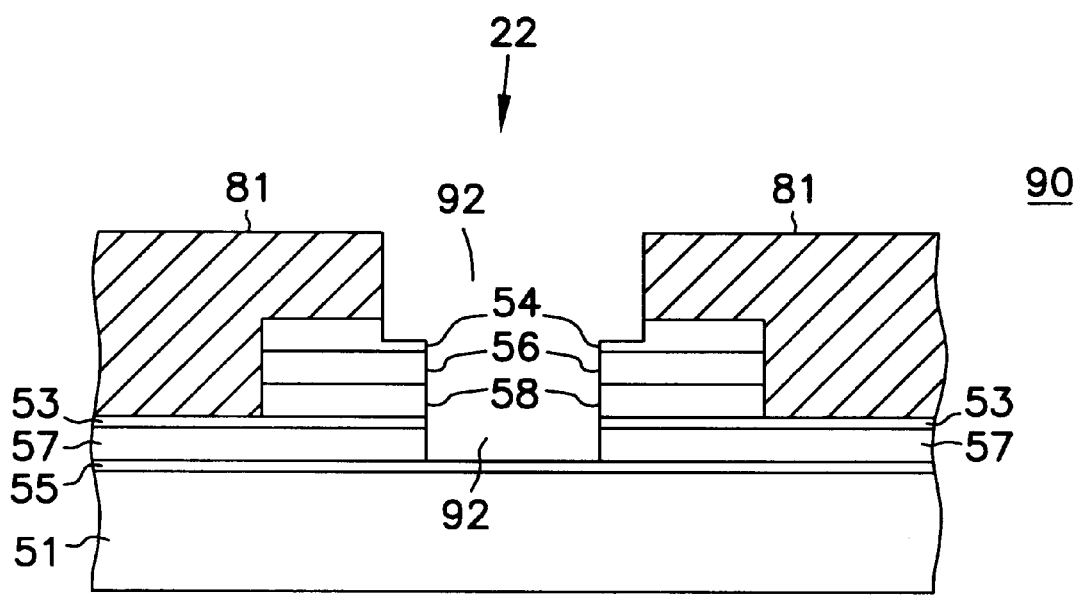
FIG. 9B illustrates a cross-sectional view of one embodiment of a partially fabricated flash cell after removing regions not covered by the patterned second resist.
Figure 10A:
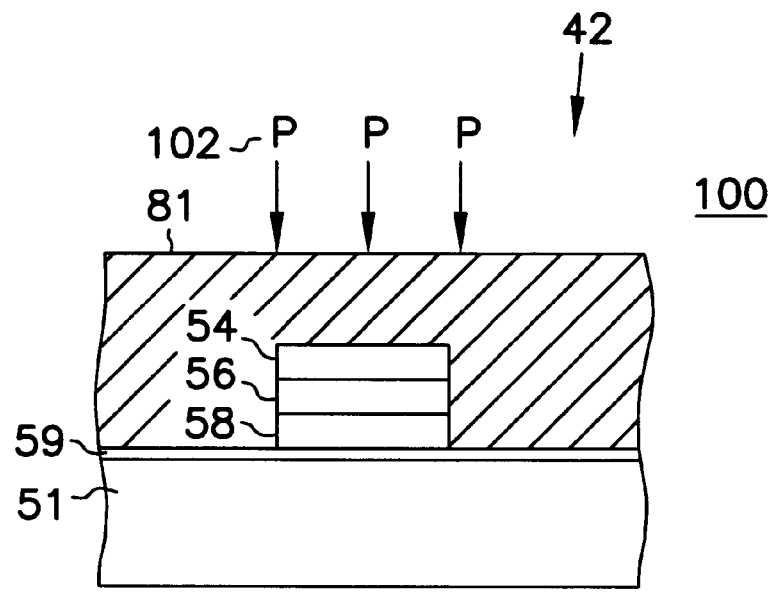
FIG. 10A illustrates a cross-sectional view of one embodiment of a partially fabricated MOS transistor covered by the patterned second resist and bombarded with p-type dopant.
Figure 10B:
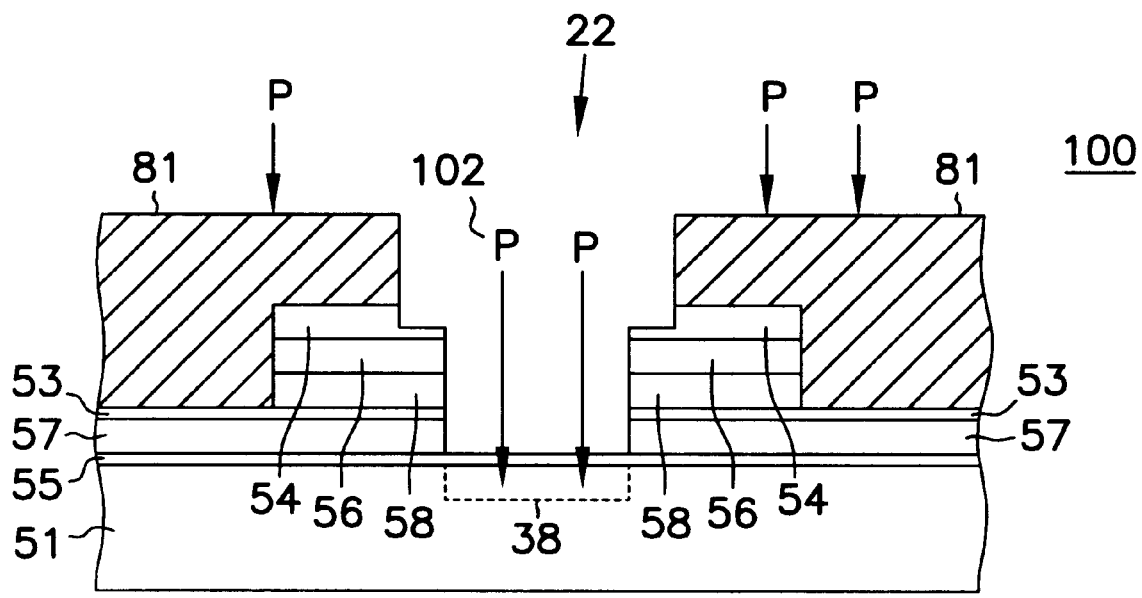
FIG. 10B illustrates a cross-sectional view of one embodiment of a partially fabricated flash cell covered by the patterned second resist and bombarded with p-type dopant.
Figure 11A:
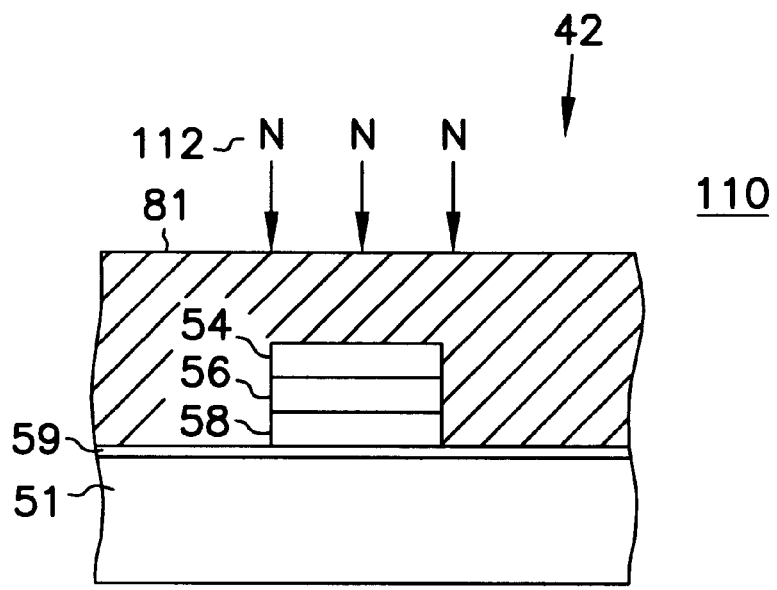
FIG. 11A illustrates a cross-sectional view of one embodiment of a partially fabricated MOS transistor covered by the patterned second resist and bombarded with first n-type dopant.
Figure 11B:
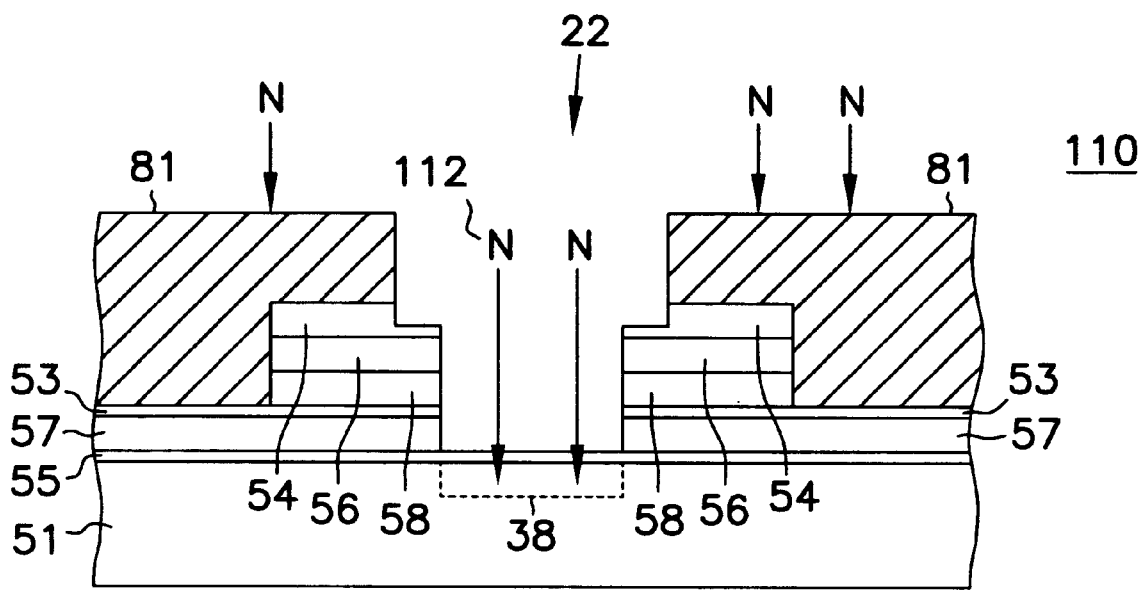
FIG. 11B illustrates a cross-sectional view of one embodiment of a partially fabricated flash cell covered by the patterned second resist and bombarded with first n-type dopant.
Figure 12A:
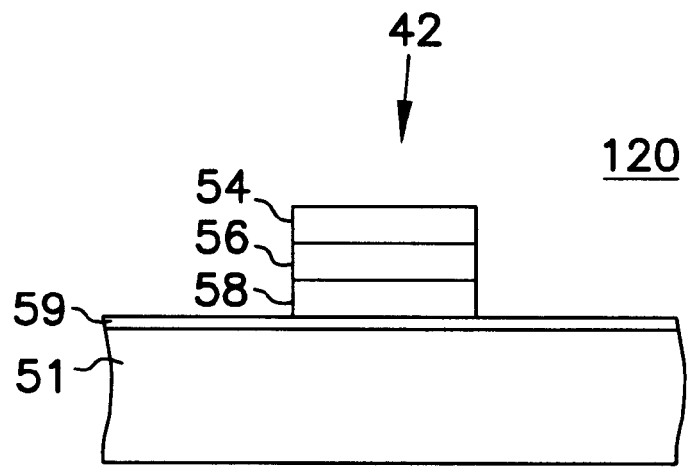
FIG. 12A illustrates a cross-sectional view of one embodiment of a partially fabricated MOS transistor after the patterned second resist is removed.
Figure 12B:
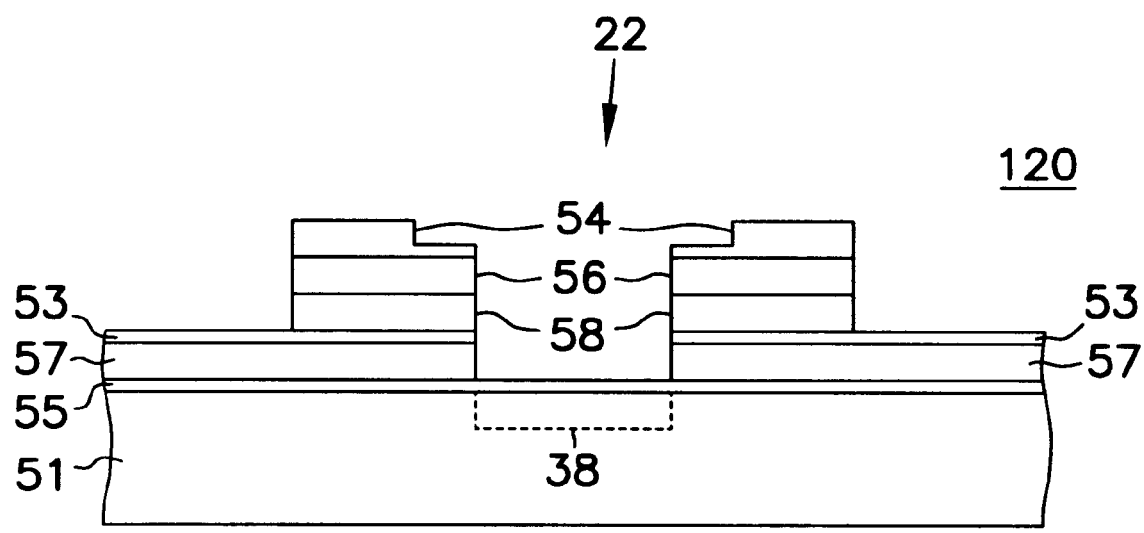
FIG. 12B illustrates a cross-sectional view of one embodiment of a partially fabricated flash cell after the patterned second resist is removed.

Next, a second resist 81 is selectively patterned on the base layer 51 (step 80), as shown in FIGS. 8A and 8B. Then, as illustrated in FIGS. 9A and 9B, a second region 92 of the first insulator 54, third insulator 53, and third conductor 57 is removed, such as by etching (step 90). Next the base layer 51, specifically the drain 38, is bombarded with p-type dopant (step 100), such as boron, as portrayed in FIGS. 10A and 10B. The p-type dopant in the drain 38 improves the charge transfer efficiency between the floating gate 34 and the channel near the drain in the flash cell 22. The base layer 51 is next preferably bombarded by a first n-type dopant (112), such as arsenic, that is directed to the drain 38 (step 110), as shown in FIGS. 11A and 11B. Next, the second resist 81 is removed from the base layer 51 (step 120), as shown in FIGS. 12A and 12B.

Figure 13A:
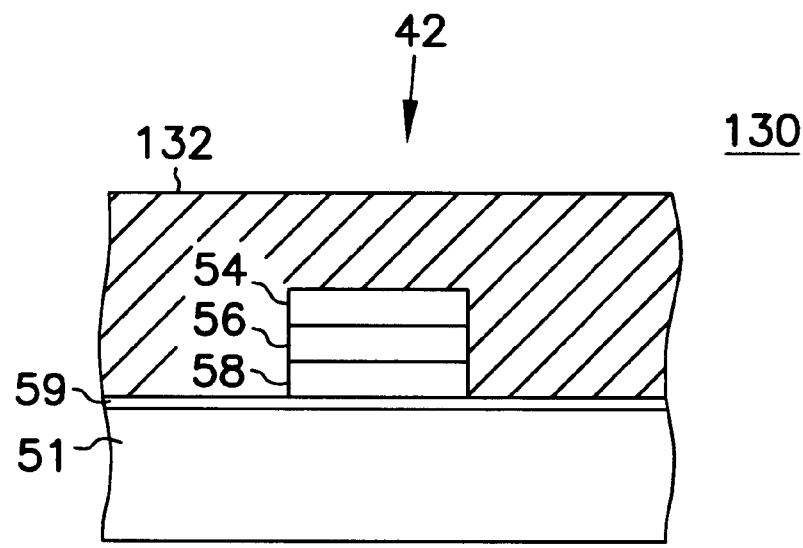
FIG. 13A illustrates a cross-sectional view of one embodiment of a partially fabricated MOS transistor covered by a patterned third resist.
Figure 13B:
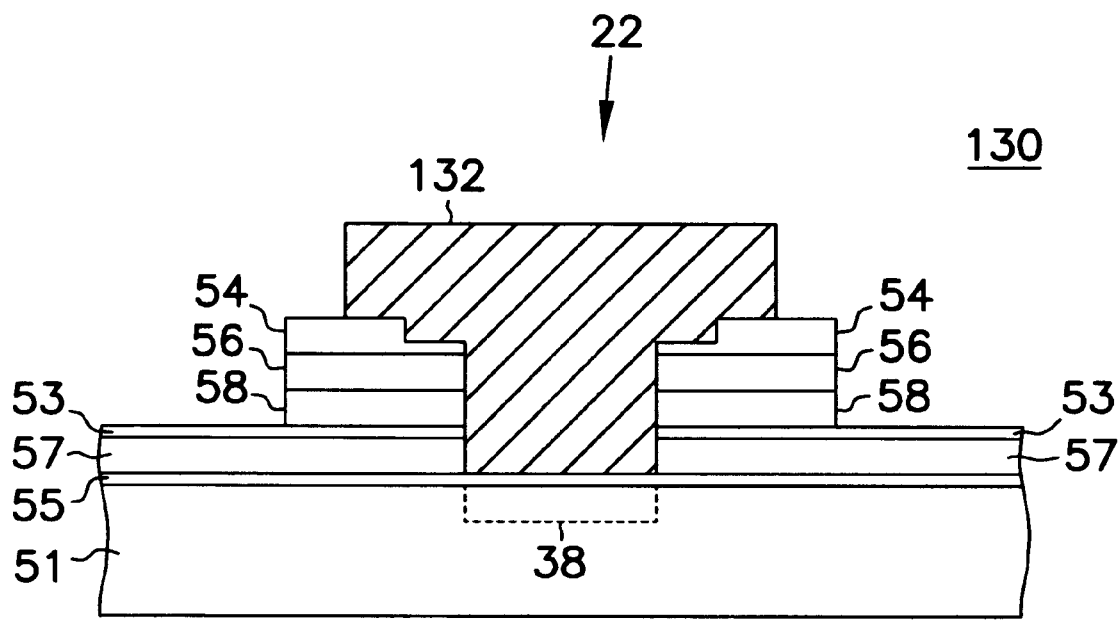
FIG. 13B illustrates a cross-sectional view of one embodiment of a partially fabricated flash cell covered by the patterned third resist.
Figure 14A:
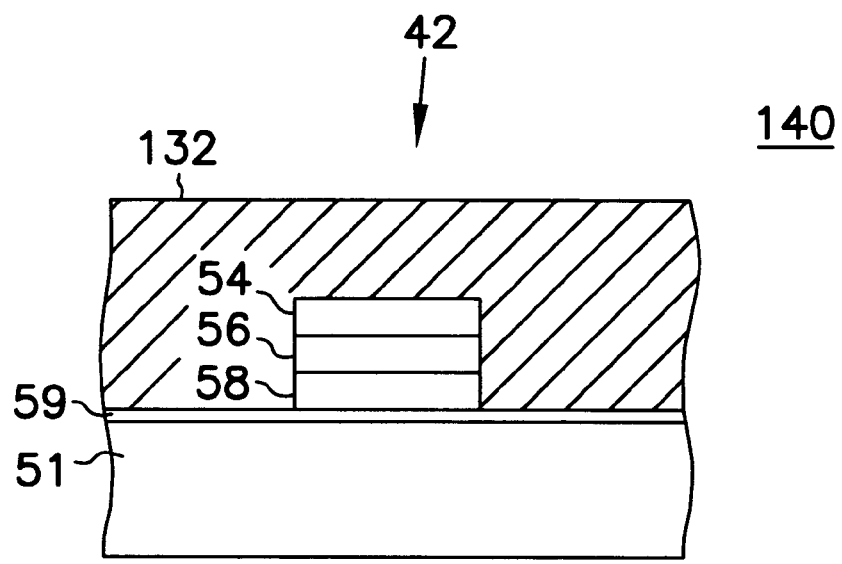
FIG. 14A illustrates a cross-sectional view of one embodiment of a partially fabricated MOS transistor having regions removed that are not covered by the patterned third resist.
Figure 14B:
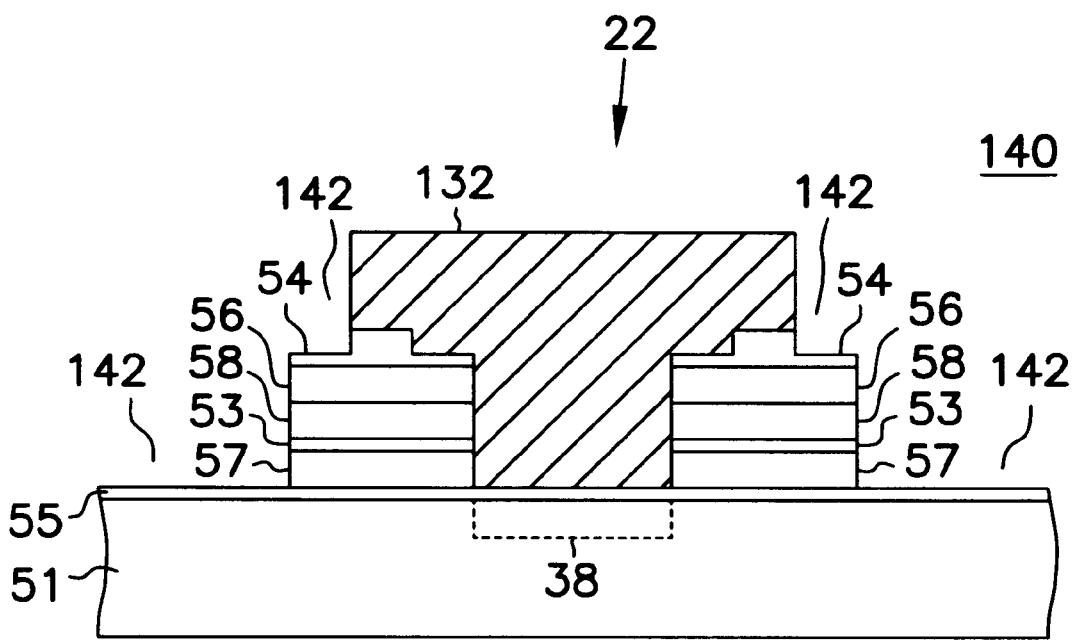
FIG. 14B illustrates a cross-sectional view of one embodiment of a partially fabricated flash cell having regions removed that are not covered by the patterned third resist.

Subsequently, a third resist 132 is patterned on the base layer 51 (step 130), as illustrated in FIGS. 13A and 13B. A third region 142 of first insulator 54, third insulator 53 and third conductor 57 not covered by the third resist 132 is subsequently removed, such as by etching (step 140), as shown in FIGS. 14A and 14B.

Figure 15A:
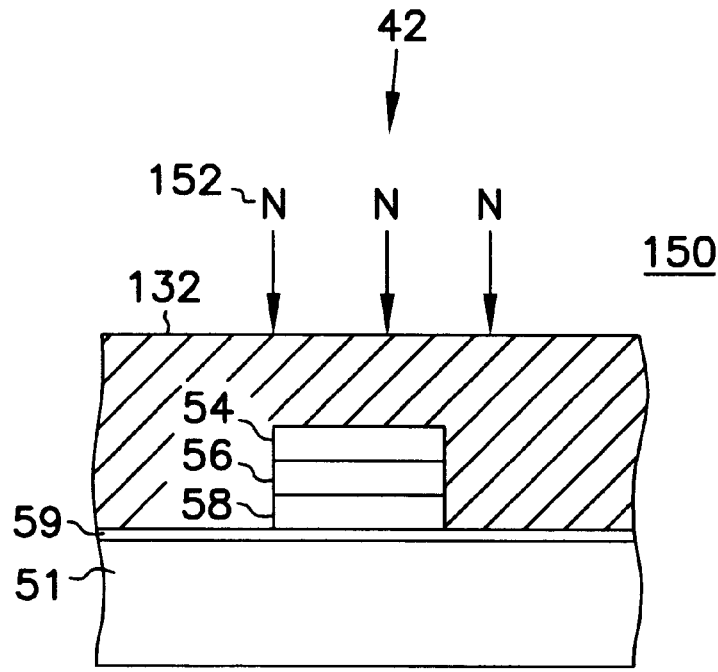
FIG. 15A illustrates a cross-sectional view of one embodiment of a partially fabricated MOS transistor covered by the patterned third resist and bombarded with second n-type dopant.
Figure 15B:
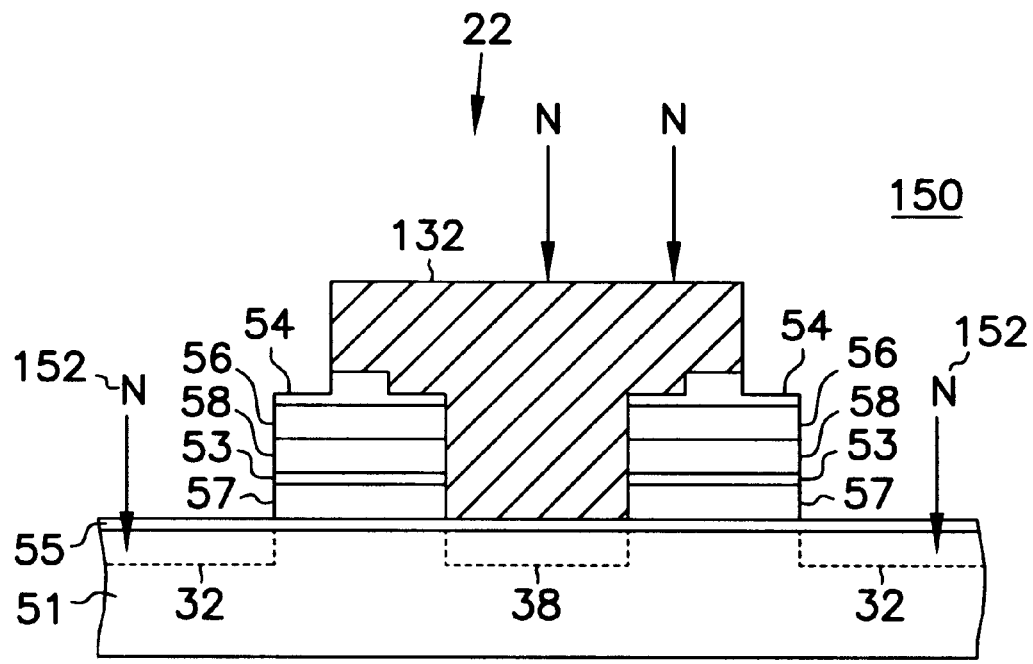
FIG. 15B illustrates a cross-sectional view of one embodiment of a partially fabricated flash cell covered by the patterned third resist and bombarded with second n-type dopant.
Figure 16A:
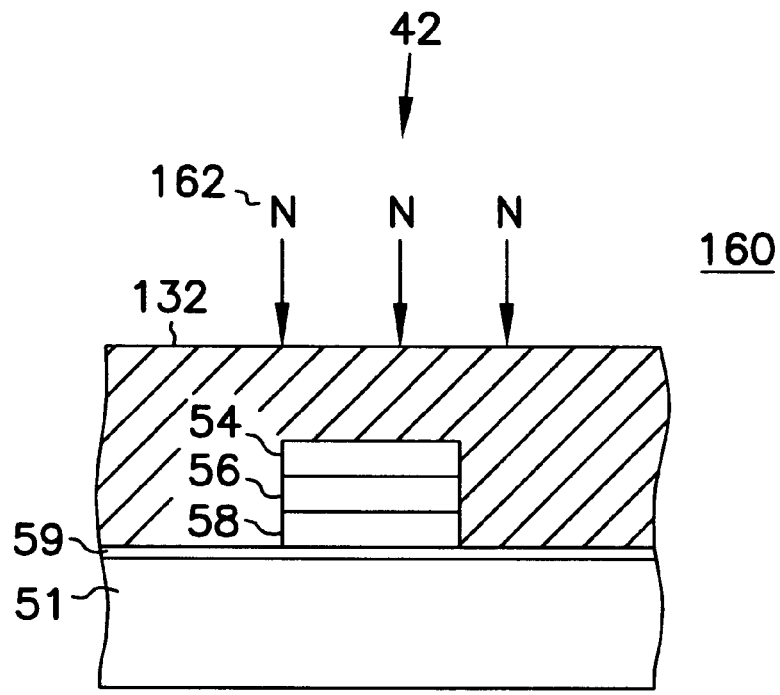
FIG. 16A illustrates a cross-sectional view of one embodiment of a partially fabricated MOS transistor covered by the patterned third resist and bombarded by third n-type dopant.
Figure 16B:
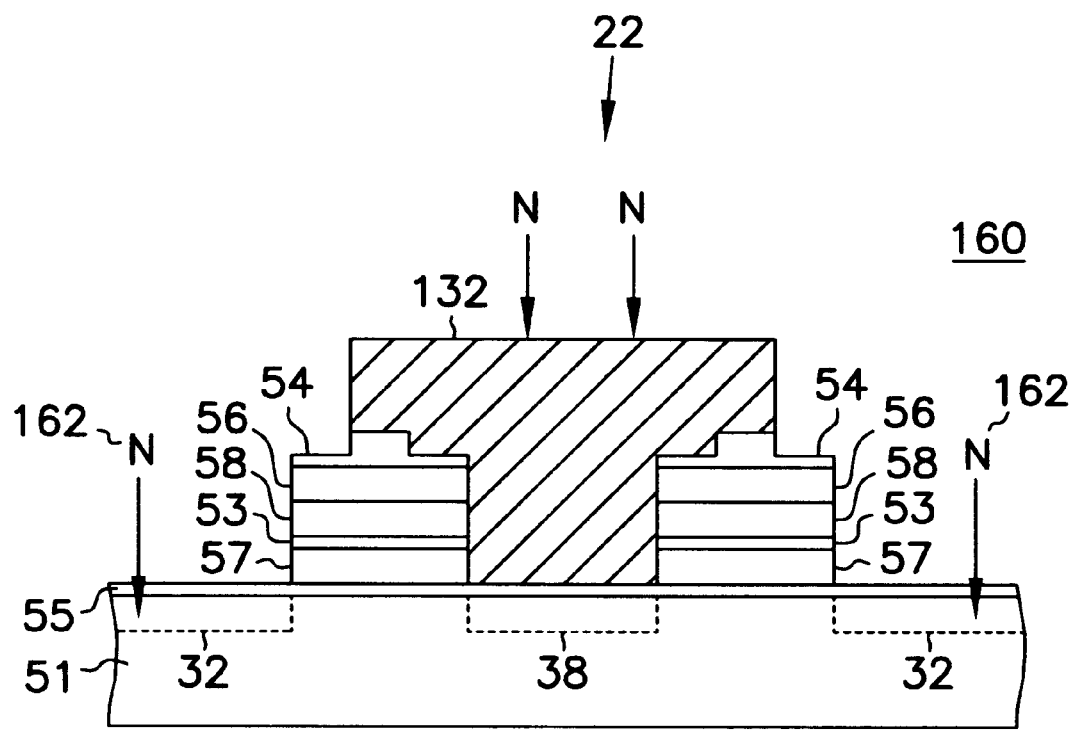
FIG. 16B illustrates a cross-sectional view of one embodiment of a partially fabricated flash cell covered by the patterned second resist and bombarded by third n-type dopant.
Figure 17A:
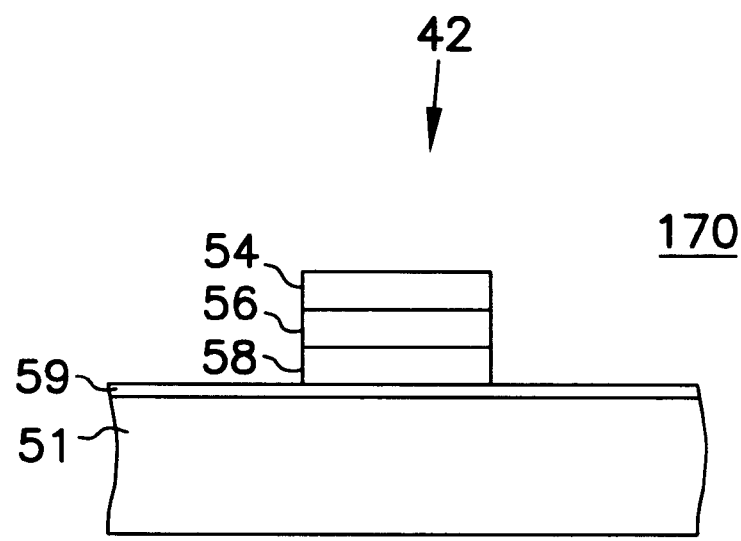
FIG. 17A illustrates a cross-sectional view of one embodiment of a partially fabricated MOS transistor after the patterned third resist is removed.
Figure 17B:
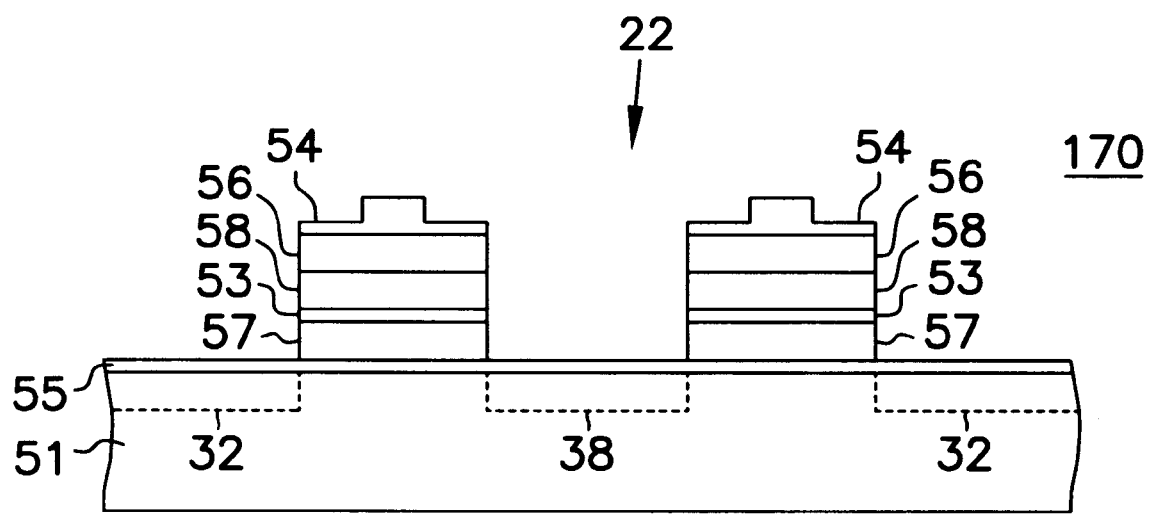
FIG. 17B illustrates a cross-sectional view of one embodiment of a partially fabricated flash cell after the patterned third resist is removed.

Then, as illustrated in FIGS. 15A and 15B, a second n-type dopant 152, such as phosphorous, is implanted into the base layer 51 (step 150) to form the sources 32 of the flash cells 22. Next, a third n-type dopant 162 is implanted into the base layer 51 (step 160), particularly into the sources 32, as illustrated in FIGS. 16A and 16B. The third resist 132 is then removed from the base layer 51 (step 170), as shown in FIGS. 17A and 17B.

Figure 18A:
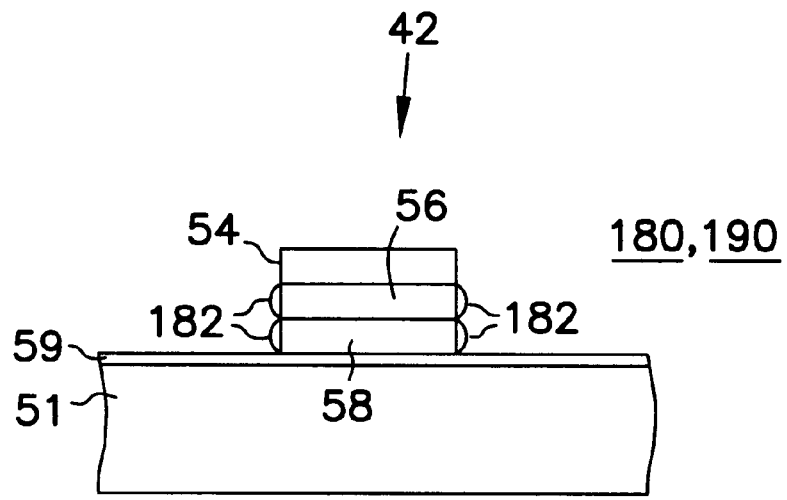
FIG. 18A illustrates a cross-sectional view of one embodiment of a partially fabricated MOS transistor after source drive and cell reoxidation processing.
Figure 18B:
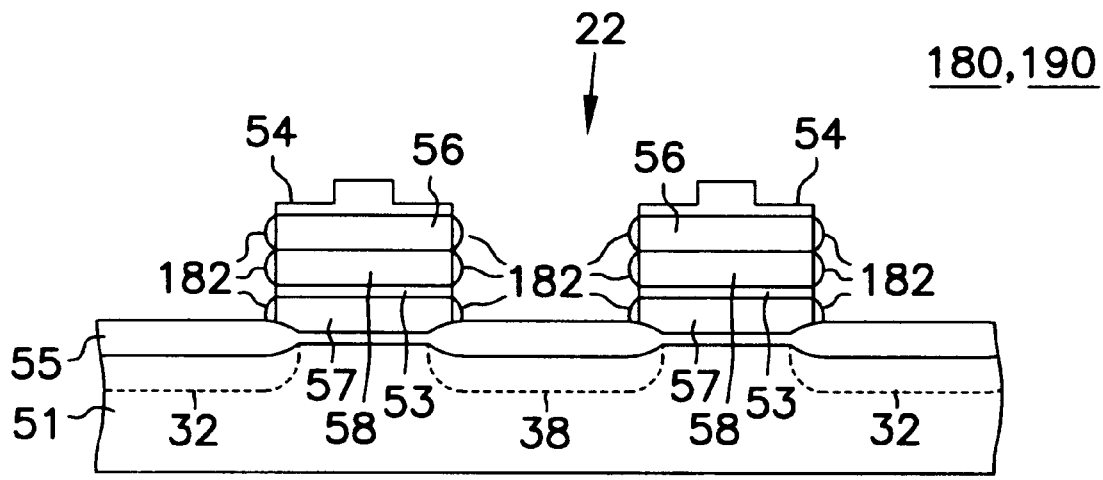
FIG. 18B illustrates a cross-sectional view of one embodiment of a partially fabricated flash cell after source drive and cell reoxidation processing.

Subsequently, the base layer 51 is heated during the source drive step (step 180) and again during the cell reoxidation step (step 190), illustrated in FIGS. 18A and 18B. The heating during the source drive step (step 180) diffuses the implanted ions 102, 112, 152, 162 from the sources 32 and drains 38 into the base layer 51. The base layer 51 heating, and thus the diffusion, continues during the cell reoxidation step (step 190). The diffusion of the implanted ions 102, 112, 152, 162 facilitates improved device performance and reliability.

Additional insulator, such as oxide, is also formed on regions of uncovered fourth insulator 55 during the cell reoxidation step (step 190). Also, a fifth insulator 182, such as oxide, is formed on regions of uncovered first, second and third conductors 56, 57, 58 during this step (step 190). As a result, the fifth insulator 182 forms adjacent to the exposed sidewalls of the first, second and third conductors 56, 57, 58.

Fabrication of the flash memory, including the MOS transistors 42 and flash cells 22, is completed with conventional processing steps. These conventional processing steps are known by persons skilled in the art.

CONCLUSION

Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. Therefore, it is manifestly intended that this invention be limited only by the claims and the equivalents thereof.

We claim:

1. A method of fabricating an integrated circuit with a flash cell and a transistor, comprising:

patterning a first resist on the flash cell and the transistor of the integrated circuit;

removing a first region not covered by the first resist on the integrated circuit;

removing the first resist from the integrated circuit;
patterning a second resist on the flash cell and the transistor of the integrated circuit; and
removing a second region not covered by the second resist on the integrated circuit, wherein the second region defines a drain of the flash cell;
wherein the first region includes:
  a conductor; and
  an insulator; and
wherein patterning and removing the first region substantially form gates of the flash cell and the transistor.

2. The method of claim 1, wherein the conductor includes first and second conductors.

3. A method of fabricating a memory, comprising:
patterning a first resist on a flash cell area and on a transistor area of a memory device;
removing a first region not covered by the first resist on the memory device;
removing the first resist from the memory device;
patterning a second resist on the flash cell area and the transistor area of the memory device; and
removing a second region not covered by the second resist on the memory device, wherein the second region defines a drain of a flash cell in the flash cell area;
wherein the first region includes:
  a conductor; and
  an insulator;
wherein patterning and removing the first region substantially form gates of the flash cell in the flash cell area and a transistor in the transistor area; and
wherein the memory device includes:
  a memory array;
  control logic; and
  address logic operatively coupled to the memory array and the control logic.

4. The method of claim 3, wherein the conductor includes first and second conductors.

5. A method of fabricating an integrated circuit with a flash cell and a transistor, where the integrated circuit has first, second, third and fourth insulators and first, second and third conductors, comprising:
patterning a first resist on a flash cell area and a transistor area of the integrated circuit;
removing a first region not covered by the first resist on the integrated circuit;
removing the first resist from the integrated circuit;
patterning a second resist on the integrated circuit;
removing a second region of the integrated circuit not covered by the patterned second resist;
bombarding the integrated circuit with p-type dopant;
bombarding the integrated circuit with first n-type dopant;
removing the patterned second resist from the integrated circuit;
patterning the integrated circuit with a third resist;
removing a third region of the integrated circuit not covered by the patterned third resist;
bombarding the integrated circuit with second n-type dopant;
bombarding the integrated circuit a second time with third n-type dopant;
removing the patterned third resist from the integrated circuit; and
heating the integrated circuit;
wherein the first region includes:
  a conductor; and
  the first insulator; and
wherein the second and third regions include:
  the third insulator; and
  the third conductor.

6. The method of claim 5, wherein bombarding the integrated circuit with first n-type dopant immediately follows bombarding the integrated circuit with p-type dopant.

7. The method of claim 5, wherein the conductor includes the first and second conductors.

8. A method of fabricating a memory with a flash cell and a transistor, comprising:
patterning a first resist on a flash cell area and a transistor area of a memory device;
removing a first region not covered by the first resist on the memory device;
removing the first resist from the memory device;
patterning a second resist on the memory device;
removing a second region of the memory device not covered by the patterned second resist;
bombarding the memory device with p-type dopant;
bombarding the memory device with first n-type dopant;
removing the patterned second resist from the memory device;
patterning the memory device with a third resist;
removing a third region of the memory device not covered by the patterned third resist;
bombarding the memory device with second n-type dopant;
bombarding the memory device a second time with third n-type dopant;
removing the patterned third resist from the memory device; and
heating the memory device.

9. The method of claim 8, wherein bombarding the memory device with first n-type dopant immediately follows bombarding the memory device with p-type dopant.

10. The method of claim 8, wherein removing a first region is performed on a layer of materials that includes an insulator and a first and second conductors.

11. A method of fabricating a flash cell and a MOS transistor, comprising:
providing a base layer
providing an MOS transistor region formed having a first insulator, a first conductor, second conductor, and second insulator, all placed above the base layer;
providing a flash cell region formed having the first insulator, the first conductor, the second conductor, a third insulator, a third conductor, and a fourth insulator, all placed above the base layer;
selectively patterning the first insulator to define a gate of the MOS transistor in the MOS transistor region and to define a gate of a flash cell in the flash cell region;
removing selected portions of the first insulator, first conductor, and second conductor to form a gate region of an MOS transistor in the MOS transistor region and to form a gate region of the flash cell in the flash cell region;
selectively patterning the third insulator to define a drain of the flash cell in the flash cell region; and
removing selected portions of the third insulator and the third conductor overlying the drain of the flash cell in the flash cell region.

12. The method according to claim 11 further including providing silicide as the first conductor.

13. The method according to claim 12 further including providing tungsten silicide as the first conductor.

14. The method according to claim 11 further including providing polysilicon as the second conductor.

15. The method according to claim 11 further including providing oxide as the first insulator.

16. The method according to claim 15 further including providing oxidenitride-oxide as the first insulator.

17. A method of simultaneously forming a flash memory cell and a transistor on a same base layer, comprising:

providing a transistor region substantially formed by adjacent materials, including a first insulator, a first conductor, a second conductor, and second insulator, all placed above the base layer;

providing a flash memory cell region substantially formed by adjacent materials, including the first insulator, the first conductor, the second conductor, a third insulator, a third conductor, and a fourth insulator, all placed above the base layer;

patterning a first photoresist on the first insulator to define the gate of a transistor in the transistor region and to define the gate of a flash memory cell in the flash memory cell region and to produce therefrom a first pattern;

removing the first insulator, the first conductor, and the second conductor according to the first pattern to form a gate stack of the transistor and to form a gate stack of the flash memory cell;

patterning a second photoresist on the third insulator to define a drain of the flash memory cell in the flash memory cell region and to produce therefrom a second pattern; and removing the third insulator and the third conductor according to the second pattern.

18. The method according to claim 17 wherein the patterning is performed by patterning a positive photoresist.

19. The method according to claim 17 wherein the base layer is silicon.

20. A method of cofabricating a floating gate transistor and a metal oxide semiconductor transistor, comprising:

providing a metal oxide semiconductor transistor region, having:
a first insulator being placed on a first conductor, the first conductor being placed on a second conductor, the second conductor being placed on a second insulator and the second insulator being placed on a base layer;

providing a floating gate transistor region, having:
the first insulator being placed on the first conductor, the first conductor being placed on the second conductor, the second conductor being placed on a third insulator, the third insulator being placed on a third conductor, the third conductor being placed on a fourth insulator, and the fourth insulator being placed on the base layer;

patterning the metal oxide semiconductor transistor region to define a metal oxide semiconductor transistor gate;

patterning the floating gate transistor region to define a floating gate transistor gate;

selectively removing portions of the metal oxide semiconductor transistor region including portions of the first insulator, the first conductor, and the second conductor, to define a structure for a gate for a metal oxide semiconductor transistor in the metal oxide semiconductor region;

selectively removing portions of the floating gate transistor region including portions of the first insulator, the first conductor, and the second conductor to define a structure for a control gate for a floating gate transistor in the floating gate transistor region simultaneous with selectively removing portions of the metal oxide semiconductor transistor region;

patterning the floating gate transistor region to define a floating gate transistor drain; and selectively removing portions of the floating gate transistor region including portions of the third insulator and the third conductor to define a structure for a drain for the floating gate transistor in the floating gate transistor region.

21. The method according to claim 20 wherein patterning the metal oxide semiconductor transistor region and patterning the floating gate transistor region to define a floating gate transistor gate are done simultaneously.

22. A method of fabricating a floating gate transistor and a metal oxide semiconductor transistor, comprising:

providing a base layer;

defining a metal oxide semiconductor transistor region on the base layer;

defining a floating gate transistor region on the base layer;

patterning the metal oxide semiconductor transistor region;

patterning the floating gate transistor region;

removing selected portions of the metal oxide semiconductor transistor region to form a first gate region;

removing first selected portions of the floating gate transistor region to form a second gate region simultaneous with removing selected portions of the metal oxide semiconductor transistor region;

patterning the floating gate transistor region a second time;

removing second selected portions of the floating gate transistor region to form a drain region;

bombarding the drain region with a dopant;

patterning the floating gate transistor region a third time; and removing third selected portions of the floating gate transistor region to form a source region.

23. The method according to claim 22 wherein bombarding is performed by bombarding with boron.

24. The method according to claim 23 wherein bombarding with boron is followed by bombarding with arsenic.

25. A method of cofabricating a floating gate transistor and a metal oxide semiconductor transistor on a single assembly, comprising:

providing a metal oxide semiconductor transistor region, having:
a first insulator being placed on a first conductor, the first conductor being placed on a second conductor, the second conductor being placed on a second insulator and the second insulator being placed on a base layer of the assembly;

providing a floating gate transistor region, having:
the first insulator being placed on the first conductor, the first conductor being placed on the second conductor, the second conductor being placed on a third insulator, the third insulator being placed on a third conductor, the third conductor being placed on a fourth insulator, and the fourth insulator being placed on the base layer of the assembly;

patterning the metal oxide semiconductor transistor region to define a metal oxide semiconductor transistor gate;

patterning the floating gate transistor region to define a floating gate transistor gate;

selectively removing portions of the metal oxide semiconductor transistor region including portions of the first insulator, the first conductor, and the second conductor to define a structure for a gate for a metal oxide semiconductor transistor in the metal oxide semiconductor region;

selectively removing portions of the floating gate transistor region including portions of the first insulator, the first conductor, and the second conductor to define a structure for a control gate for a floating gate transistor in the floating gate transistor region simultaneous with selectively removing portions of the metal oxide semiconductor transistor region;

patterning the floating gate transistor region to expose a drain region while protecting the metal oxide semiconductor transistor region;

selectively removing portions of the floating gate transistor region including portions of the first insulator, the third insulator and the third conductor to substantially form a drain region;

doping the drain region of the floating gate transistor region;

patterning the floating gate transistor region to expose a source region while protecting the metal oxide semiconductor transistor region;

selectively removing portions of the floating gate transistor region including portions of the first insulator, the third insulator and the third conductor to substantially form a source region;

doping the source region of the floating gate transistor region; and heating the assembly to diffuse dopants into the base layer.

26. The method according to claim 25 wherein doping the drain region of the floating gate transistor region includes bombarding the drain region with boron followed by arsenic.

27. The method according to claim 25 wherein doping the source region of the floating gate transistor region includes bombarding the source region with phosphorous.

28. A method of cofabricating a floating gate transistor and a metal oxide semiconductor transistor, comprising:

providing a metal oxide semiconductor transistor region, having:
a first insulator of oxide located on a first conductor of tungsten silicide, the first conductor being located on a second conductor of polysilicon, the second conductor being located on a second insulator of oxide and the second insulator being located on a base layer;

providing a floating gate transistor region, having:
the first insulator located on the first conductor, the first conductor located on the second conductor, the second conductor located on a third insulator of oxide-nitride-oxide, the third insulator located on a third conductor of polysilicon, the third conductor located on a fourth insulator of oxide, and the fourth insulator located on the base layer;

applying a first resist over the first insulator of the [a] metal oxide semiconductor transistor region and the floating gate transistor region;

patterning the first resist on the first insulator of the metal oxide semiconductor transistor region to define a metal oxide semiconductor transistor gate region and selectively patterning the first resist on the floating gate transistor region to define a floating gate transistor gate region;

etching portions of metal oxide semiconductor transistor region exposed by the first resist including portions of the first insulator, the first conductor, and the second conductor, to define a structure for a gate for a metal oxide semiconductor transistor in the metal oxide semiconductor region;

etching portions of the floating gate transistor region exposed by the first resist including portions of the first insulator, the first conductor, and the second conductor to define a structure for a control gate for a floating gate transistor in the floating gate transistor region;

removing the first resist;

applying a second resist over the metal oxide semiconductor transistor region and the floating gate transistor region;

patterning the second resist onto the floating gate transistor region to define a drain region;

etching portions of the floating gate transistor region exposed by the second resist including portions of the first insulator, the third insulator and the third conductor to substantially form a drain region;

doping the drain region of the floating gate transistor region with boron;

doping the drain region with arsenic;

applying a third resist over the metal oxide semiconductor transistor region and the floating gate transistor region;

patterning the third resist over the floating gate transistor region to expose a source region;

etching portions of the floating gate transistor region including portions of the first insulator, the third insulator and the third conductor to substantially form a source region;

doping the source region of the floating gate transistor region with phosphorous; and heating the assembly to diffuse dopants into the base layer.

* * * * *

UNITED STATES PATENT AND TRADEMARK OFFICE
CERTIFICATE OF CORRECTION

PATENT NO.   : 6,087,221                                          Page 1 of 1
DATED        : July 11, 2000
INVENTOR(S)  : Rettschlag et al.

It is certified that error appears in the above-identified patent and that said Letters Patent is hereby corrected as shown below:

Column 6,
Line 9, after "floating gate", delete -- 34 --.

Column 12,
Line 9, after "of the", delete -- [a] --.

Signed and Sealed this

Twenty-first Day of August, 2001

Attest:

NICHOLAS P. GODICI
Attesting Officer         Acting Director of the United States Patent and Trademark Office